(12) United States Patent
Hsu et al.

(10) Patent No.: US 9,806,012 B2
(45) Date of Patent: Oct. 31, 2017

(54) IC CARRIER OF SEMICONDUCTOR PACKAGE AND MANUFACTURING METHOD THEREOF

(71) Applicant: Phoenix Pioneer Technology Co., Ltd., Hsinchu County (TW)

(72) Inventors: Shih-Ping Hsu, Hsinchu County (TW); Chao-Tsung Tseng, Hsinchu County (TW)

(73) Assignee: PHOENIX PIONEER TECHNOLOGY CO., LTD., Hsinchu County (TW)

(*) Notice: Subject to any disclaimer, the term of this patent is extended or adjusted under 35 U.S.C. 154(b) by 0 days.

(21) Appl. No.: 15/206,471

(22) Filed: Jul. 11, 2016

(65) Prior Publication Data

US 2017/0162492 A1 Jun. 8, 2017

(30) Foreign Application Priority Data

Dec. 4, 2015 (CN) .......................... 2015 1 0884611

(51) Int. Cl.
*H01L 23/498* (2006.01)
*H01L 21/48* (2006.01)
*H01L 23/00* (2006.01)

(52) U.S. Cl.
CPC ...... *H01L 23/49827* (2013.01); *H01L 21/486* (2013.01); *H01L 24/16* (2013.01); *H01L 24/49* (2013.01); *H01L 2224/16151* (2013.01); *H01L 2224/48221* (2013.01)

(58) Field of Classification Search
CPC combination set(s) only.
See application file for complete search history.

(56) References Cited

U.S. PATENT DOCUMENTS 7,642,128 B1 * 1/2010 Lin ..................... H01L 21/6835
257/E21.508
2014/0021593 A1 * 1/2014 Jang .................. H01L 23/49541
257/667

FOREIGN PATENT DOCUMENTS

| TW | 200948232 A | 11/2009 |
| TW | 201113999 A | 4/2011 |
| TW | 201541587 A | 11/2015 |

* cited by examiner

*Primary Examiner* — Kyoung Lee
*Assistant Examiner* — Ratisha Mehta
(74) *Attorney, Agent, or Firm* — McClure, Qualey & Rodack, LLP (57) ABSTRACT

The present invention discloses an IC Carrier of a semiconductor package and its manufacturing method. The IC Carrier of the semiconductor package includes a dielectric layer and a patterned conductor layer. The dielectric layer has at least one opening groove. The patterned conductor layer is embedded in the dielectric layer, wherein a part of the patterned conductor layer is as a conductive pillar, which has two exposed ends, and a part of the patterned conductor layer is as a conductive wire, which only has one exposed end.

16 Claims, 6 Drawing Sheets

IC CARRIER OF SEMICONDUCTOR PACKAGE AND MANUFACTURING METHOD THEREOF

CROSS REFERENCE TO RELATED APPLICATIONS

This Non-provisional application claims priority under 35 U.S.C. §119(a) on Patent Application No. 201510884611.1 filed in People's Republic of China on Dec. 4, 2015, the entire contents of which are hereby incorporated by reference.

BACKGROUND

1. Technical Field

The disclosure relates to a carrier and its manufacturing method, in particularly, to an IC carrier of a semiconductor package and its manufacturing method applied in the low-pin-count semiconductor package field.

2. Description of Related Art

The electrical technology is rapid growth to meet the expectations of people. The integrated circuit semiconductor package technology is developed toward the feature of miniaturization and high-density to achieve the advantage of high-speed processing, multi-functional and integrated.

In the present semiconductor package technology, the low-pin count package mainly utilizes, the technique of Lead Frame Packaging, Quad Flat Packaging, Chip Scale Packaging and Wafer Level Chip Scale Packaging. The technique of the above are met the bottleneck of the feature of small size, thin, low cost and fine-pitch for making the carrier or the lead frame of the package.

In the case of lead frame package, the lead frame is thick and hard to reduce the pitch of the conductive wire or make the explicit circuit layout so that the lead frame cannot provide the electromagnetic protection to the chip disposed thereon. The dielectric material of the present carrier usually uses a core with glass fiber or resin, plate. In addition, the carrier is usually processed by laser drilling to make the holes for electrically connected, however the laser drilling on the carrier with glass fiber core having the shortcoming of slow processing speed, high cost and opening miniaturized difficulty. Furthermore, the carrier easy to be warped during the thinning process when the dielectric material is BT, FR4, FR5 or ABF.

For example, on the lead frame packaging process architecture, the thickness of the lead frame they use tend to be larger, and further, because it cannot form a finer line, line spacing, and line layout, so the wire frame could not wafer disposed thereon having a protective effect of electromagnetic waves. In addition, existing carrier board is the use of a dielectric material or a resin film having a core layer of glass fibers and as electrically connected with a laser drilling, but the laser glass fiber materials output slow drilling of high cost and the aperture is not easy miniaturization. Furthermore, when the dielectric material using BT fiberglass, FR4, FR5 or ABF and other materials and solder materials in the thinning process prone to warping. More persons, the dielectric material made of glass fibers also increases the difficulty and cost of the fine line processing.

It is therefore an important subject of the invention to provide an IC carrier of a semiconductor package and its manufacturing method to meet the requirement of the low-pin count package structure.

SUMMARY OF THE INVENTION

In view of the foregoing, the invention is to provide an IC carrier of a semiconductor package and its manufacturing method, which has the benefit of rentable, short-pitch and thin carrier.

In addition, the invention is to provide an IC carrier of a semiconductor and manufacturing method, which meets the requirement of compact size and low cost in the low-pin-count semiconductor package field.

To achieve the above, the application, provides an IC carrier, which includes a dielectric layer and a patterned conductor layer. The dielectric layer has at least one opening groove. The patterned conductor layer is embedded in the dielectric layer. A pail of the patterned conductor layer is as a conductive pillar, which has two exposed ends. A part of the patterned conductor layer is as a conductive wire, which only has one exposed end.

Additionally to achieve the above, the application provides a manufacturing method for making an IC carrier of a semiconductor package, which includes the following steps. Step 1 is forming a patterned conductor layer on a surface of a temporary substrate. Step 2 is forming a dielectric layer on the temporary substrate to cover the patterned conductor layer. Step 3 is forming an opening groove on the dielectric layer to expose a part of the patterned conductor layer, wherein, a part of the patterned conductor layer is as a conductive pillar, which has two exposed ends, and a part of the patterned conductor layer is as a conductive wire, which only has one exposed end.

BRIEF DESCRIPTION OF THE DRAWINGS

The pans in the drawings are not necessarily drawn to scale, the emphasis instead being placed upon clearly illustrating the principles of at least one embodiment in the drawings, like reference numerals designate corresponding parts throughout the various diagrams, and all the diagrams are schematic.

DETAILED DESCRIPTION

Reference will now be made to the drawings to describe various inventive embodiments of the present disclosure in detail, wherein like numerals refer to like elements throughout.

Figure 1:
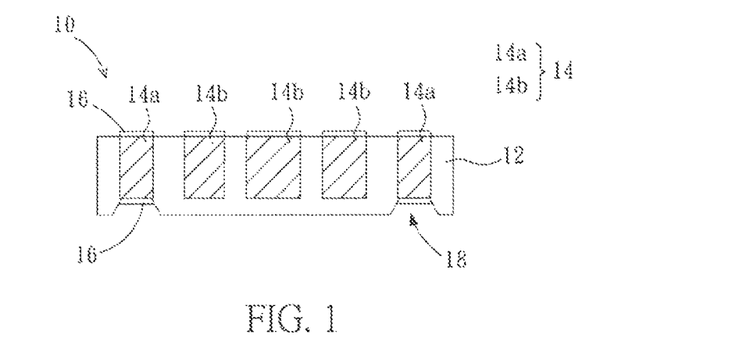
FIG. 1 is a schematic diagram showing an IC carrier of a semiconductor package according to the first embodiment of the invention.

The embodiment according to the invention is to provide an IC carrier of a semiconductor package, which has the advantage of small size, short line spacing, thin carrier and low cost is applied in the field of the low-pin-count semiconductor package. FIG. 1 is a schematic diagram showing an IC carrier of a semiconductor package according to the first embodiment of the invention. Referring to FIG. 1, an IC carrier 10 of a semiconductor package includes a dielectric layer 12 and at least a patterned conductive layer 14. The patterned conductive layer 14 is embedded in the dielectric layer 12 and has at least a first conductive part and at least a second conductive part. The first conductive part and the second conductive part are isolated by the dielectric layer 12. The dielectric layer 12 has at least an opening groove 18 to expose the first conductive part and/or the second conductive part. In the embodiment, the two ends of the first conductive part are exposed from the opening grooves 18 of the dielectric layer 12 so that the first conductive part is a conductive pillar 14a to electrically conduct an upper electrical layer and a lower electrical layer disposed at two sides of the dielectric layer 12. In the embodiment, only one end of the second conductive part is exposed from the opening groove 18 of the dielectric layer 12 so that the second conductive part is a conductive wire 14b to be a circuit layout. In addition, a part of the conductive wire 14b may be a conductive pad to electrically connect to an electrical element.

The patterned conductive layer 14 exposed from the dielectric layer 12 is so called an open type in the embodiment. The open type is meaning that the patterned conductive layer 14 not be covered by the dielectric layer 12. In other words, the patterned conductive layer 14 exposed from the dielectric layer 12 is the open type whether or not covered by other elements.

The conductive pillar 14a and the conductive wire 14b are formed simultaneously when forming the patterned conductive layer 14. The height of the dielectric layer is similar to the height of the patterned conductive layer 14 due to the patterned conductive layer 14 is embedded in the dielectric layer 12. Therefore, the thickness of the IC carrier can be reduced.

Further, a protective layer 16 is disposed on the patterned conductive layer 14 exposed from the dielectric layer 12 to avoid the oxidation reaction of the pattern conductive layer 14.

Figure 2:
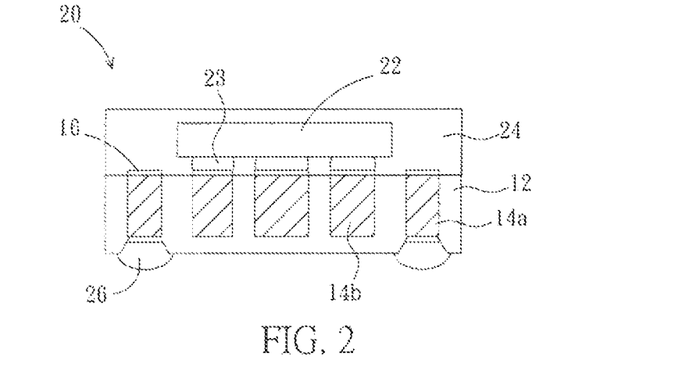
FIG. 2 is a schematic diagram showing the IC carrier of the semiconductor package of FIG. 1, which is applied to a Ball Grid Array (BGA) package.

In the first embodiment, the IC carrier 10 can be applied to a BGA package. Referring to FIG. 2, a package structure 20 includes a chip 22, a sealing layer 24 and at least a solder bump 26. The chip 22 is electrically connected to the conductive wire 14b of the IC carrier 10 through the protective layer 16 and at least a conductive bump 23. In the embodiment, the chip 22 is electrically connected to the IC carrier by the Flip-Chip technology. The sealing layer 24 is disposed around the chip 22 to seal the conductive pillar 14a, the conductive wire 14b and the protective layer 16, which are exposed from the dielectric layer 12 to avoid the moisture. The solder bump 26 is disposed in the opening groove 18 not be covered by the sealing layer 24. The solder bump 26 can be a conductive pad to electrically connect to a circuit board (not shown in figure).

Figure 3:
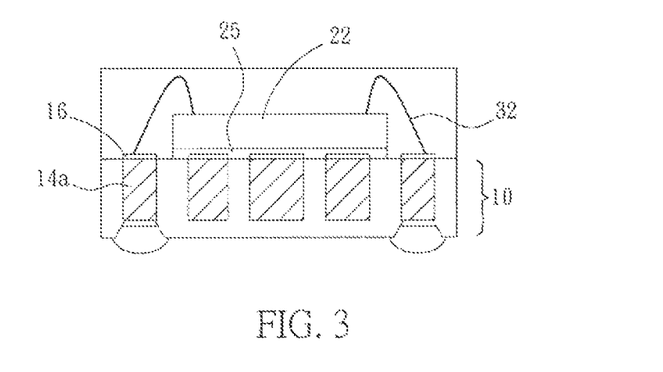
FIG. 3 is another schematic diagram showing the IC carrier of the semiconductor package of FIG. 1, which is applied to a BGA package.

Referring to FIG. 3, in other embodiment, the chip 22 can be fixed temporarily on the IC carrier 10 by a fixed glue 25 or a fixed plastic, then the chip 22 is electrically connected to the conductive pillar 14a of the IC carrier 10 through the protective layer 16 by a metal wire 32, which is so called the wire bonding technology.

Referring to FIG. 1, the dielectric layer 12 is to carry and protect the patterned conductive layer 14. The material of the dielectric layer 12 can be a molding compound for chip packaging, for example the molding compound having Novolac-Based Resin, Epoxy-Based Resin or Silicone-Based Resin. In addition, the molding compound can include a filler, for example the powdered silicon.

In the embodiment, the material of the patterned conductive layer 14 is metal which is selected from the group consisting of copper, iron, silver, nickel or a combination thereof.

Figure 4A:
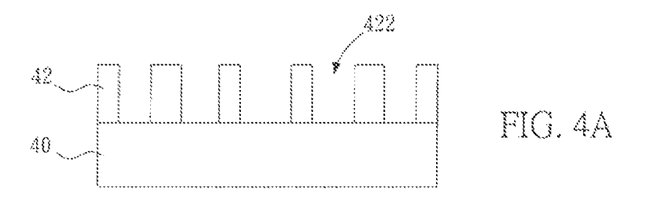
FIGS. 4A to 4F are schematic diagrams showing a manufacturing step for making the IC carrier of the semiconductor package of FIG. 1.

FIGS. 4A to 4F are schematic diagrams showing a manufacturing method for making the IC carrier of the semiconductor package of FIG. 1. Referring to FIG. 4A, a detachable temporary substrate 40 is provided and a patterned photoresist layer 42 having a plurality of openings 422 is formed on a surface of the temporary substrate 40. The patterned photoresist layer 42 is made by photolithography technology. The material of the temporary substrate 40 is made by iron, nickel copper or composite with a dielectric material.

Figure 4B:
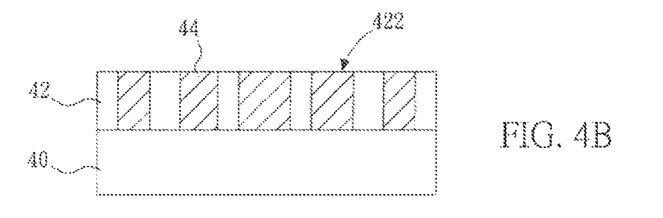

Referring to FIG. 4B, a conductive material 44 is formed in the openings 422 of the patterned photoresist layer 42. In the embodiment, the material of the conductive material 44 is metal for example, which is selected from the group consisting of copper, iron, silver, nickel or a combination thereof. According to the different material, the conductive material 44 can be made by plating technology, electroless plating technology, sputtering coating technology or thermal coating technology.

Figure 4C:
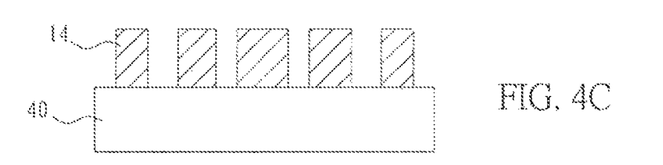

Referring to FIG. 4C, a patterned conductive layer 14 having at least a first conductive part and at least a second conductive part is formed by removing the patterned photoresist layer 42. Then, referring to FIG. 4D, a dielectric layer 12 is formed to cover the patterned conductive layer 14 by vacuum laminating technology or molding technology. The material of the dielectric layer 12 can be a molding compound for chip packaging, for example the molding compound having Novolac-Based Resin, Epoxy-Based Resin or Silicone-Based Resin. In addition, the molding compound can include a filler, for example the powdered silicon dioxide.

Figure 4D:
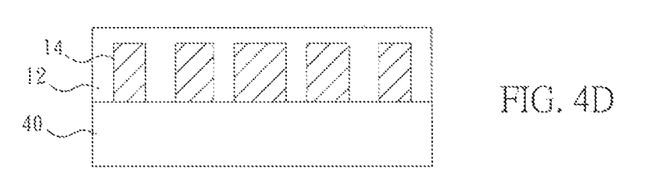

In addition the manufacturing method further includes the following steps to form the dielectric layer 12 utilizes molding technology. First a molding compound with the resin and powdered silicon dioxide is to be provided, Second the molding compound is to be heated into liquid. Third, the liquid molding compound is to be injected into the third opening to cover the patterned conductor layer in the environment with high temperature and high pressure. Fourth, the liquid molding compound is to be cured to form a dielectric layer 12. In the embodiment, the dielectric layer 12 made by vacuum laminating technology or molding technology may be called a molding dielectric layer.

Figure 4E:
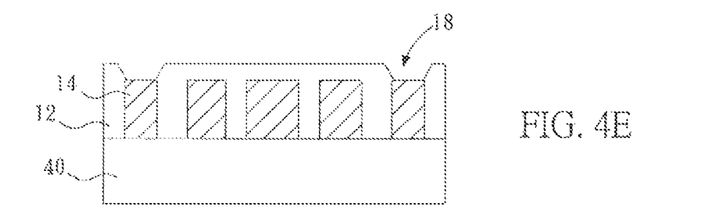

Referring to FIG. 4E, a part of the dielectric layer 12 located above the patterned conductive layer 14 is to be removed to form a plurality of opening grooves 18 to expose a part of patterned conductive layer 14. In the embodiment, the dielectric layer 12 is removed by the technology of grinding, plasma or Reactive Ion Etch (RIE).

Figure 4F:
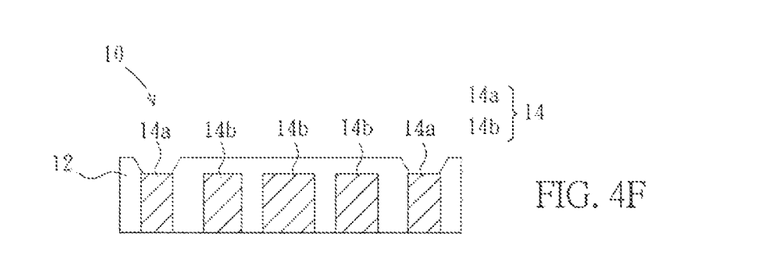

Referring to FIG. 4F, an IC carrier 10 is to be obtained after removing the temporary substrate 40. One side of the patterned conductive layer 14 is exposed for electrically connecting to other electrical elements when the temporary substrate 40 is removed. Herein, a part of the patterned conductive layer 14 is as a conductive pillar 14a, which has two exposed ends and a part of the patterned conductive layer 14 is as a conductive wire 14b, which only has one exposed end.

Figure 4G:
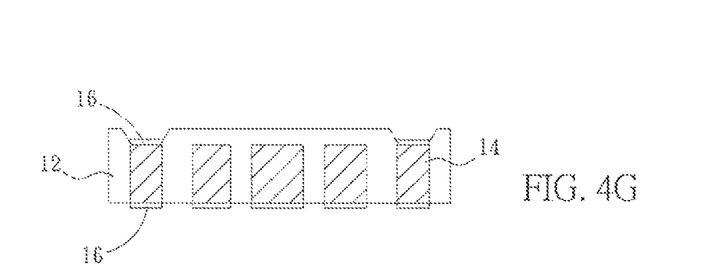
FIG. 4G is a schematic diagram showing the IC carrier of the semiconductor package having a protective layer.

Referring to FIG. 4G the IC carrier 10 further includes a protective layer 16. The protective layer 16 is disposed on the patterned conductive layer 14, which is exposed from the dielectric layer 12, to avoid the oxidation reaction of the patterned conductive layer 14. In the embodiment, the protective layer 16 may be an Organic Solderability Preservative (OSP), Ni/Pd/Au coating or Ni/Ag coating.

Figure 5:
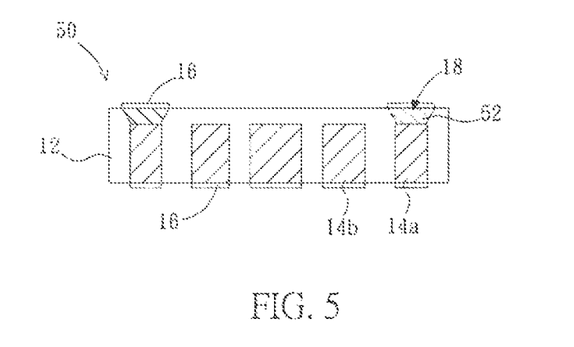
FIG. 5 is a schematic diagram showing an IC carrier of a semiconductor package according to the second embodiment of the invention.

FIG. 5 is a schematic diagram showing an IC carrier 50 of a semiconductor package according to the second embodiment of the invention. In the embodiment, the IC carrier 50 further includes a conductive layer 52 so that the height of the conductive pillar 14a and the conductive layer 52 is similar to the height of the dielectric-layer 12.

In the embodiment, the IC carrier 50 further includes the protective layer 16. The protective layer 16 is disposed on the conductive pillar 14a, the conductive wire 14b or the conductive layer 52, which are exposed from the dielectric layer 12.

Figure 6:
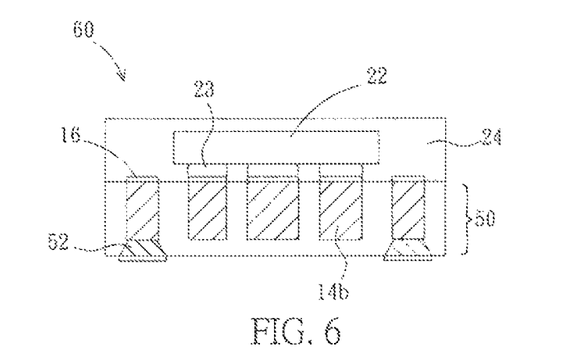
FIG. 6 is a schematic diagram showing the IC carrier of the semiconductor package of FIG. 5, which is applied to a Land grid array (LGA) package.
Figure 7:
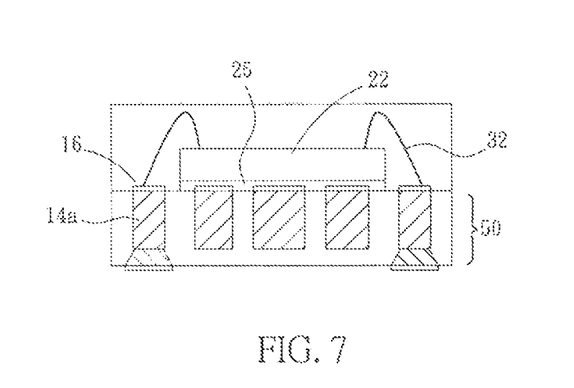
FIG. 7 is another schematic diagram showing the IC carrier of the semiconductor package of FIG. 5, which is applied to a LGA package.

FIG. 6 is a schematic diagram showing the IC carrier 50 of the semiconductor package of FIG. 5 which is applied to a LGA package. Referring to FIG. 6, a package structure 60 includes a chip 22 and a sealing layer 24. The chip 22 is electrically connected to the conductive wire 14b of the IC carrier 50 through the protective layer 16 and at least a conductive bump 23. In the embodiment, the chip 22 is electrically connected to the IC carrier by the Flip-Chip technology. The sealing layer 24 is disposed around the chip 22 to seal the conductive wire 14b, which is exposed from the dielectric layer 12 to avoid the moisture. Referring to FIG. 7, in other embodiment, the chip 22 can be fixed temporarily on the IC carrier 50 by a fixed glue 25 or a fixed plastic, then the chip 22 is electrically connected to the conductive pillar 14a of the IC carrier 50 through the protective layer 16 by a metal wire 32, which is so called the wire bonding technology.

Figure 8A:
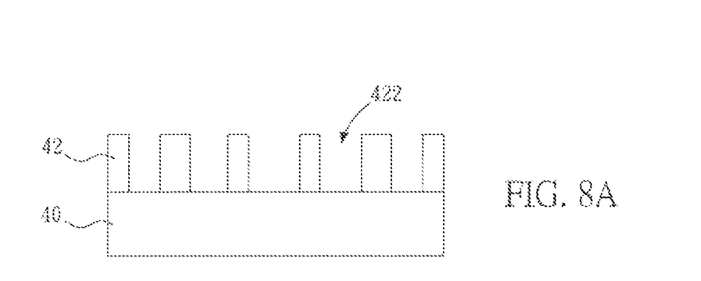
FIGS. 8A to 8F are schematic diagrams showing a manufacturing method for making the IC carrier of the semiconductor package of FIG. 5.
Figure 8B:
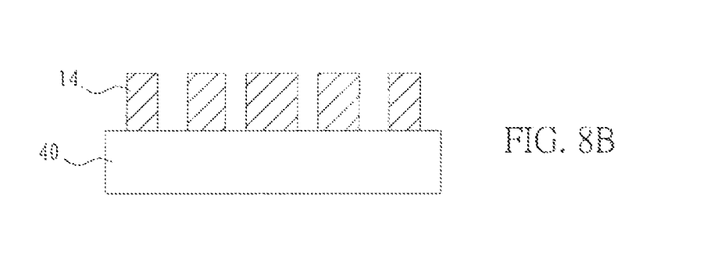

FIGS. 8A to 8F are schematic diagrams showing a manufacturing method for making the IC carrier of the semiconductor package of FIG. 5. Referring to FIG. 8A, step 1 is to provide a detachable temporary substrate 40 and to form a patterned photoresist layer 42 having a plurality of openings 422 on a surface of the temporary substrate 40.

Figure 8C:
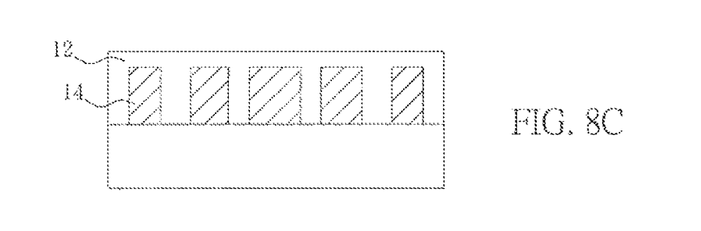

Referring to FIG. 4B, a conductive layer is formed in the openings 422 of the patterned photoresist layer 42. Then, a patterned conductive layer 14 is obtained after removing the patterned photoresist layer 42. Referring to FIG. 8C, a dielectric layer is formed to cover the patterned conductive layer 14.

Figure 8D:
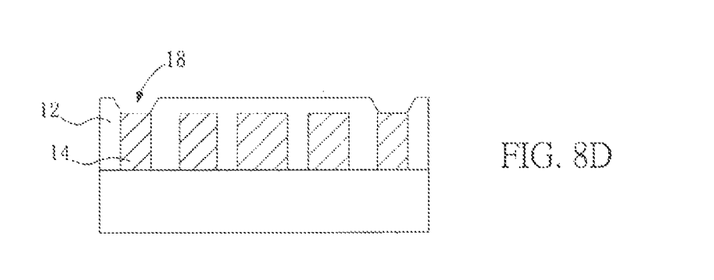

Referring to FIG. 8D, at least an opening groove 18 is formed on the dielectric layer 12 to expose a surface of a part of the patterned conductive layer 14.

Figure 8E:
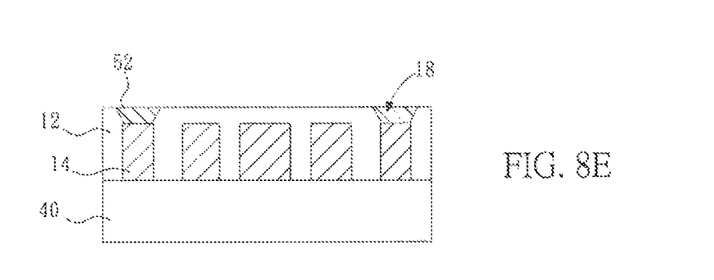

Referring to FIG. 8E, a conductive layer 52 is filled in the opening groove 18 so that the height of the patterned conductive layer 14 exposed from the opening groove 18 and the conductive layer 52 is similar to the height of the dielectric layer 12.

Figure 8F:
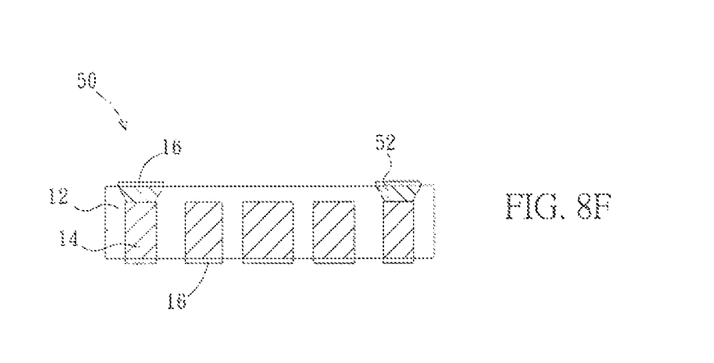

Referring to FIG. 8F, the IC carrier 50 is to be obtained after removing the temporary substrate 40. One side of the patterned conductive layer 14 is exposed for electrically connecting to other electrical elements when the temporary substrate 40 is removed. The IC carrier 50 further includes a protective layer 16. The protective layer 16 is disposed on the conductive layer 52, which is exposed from the dielectric layer 12, to avoid the oxidation reaction of the conductive layer 52.

The detail manufacturing method shows in FIGS. 8A to 8F is no longer repeat due to it can be similar to the content of FIGS. 4A to 4F.

As mentioned above, the IC carrier of the semiconductor package and its manufacturing method, which the conductive pillar and the conductive wire are formed simultaneously while forming the patterned conductor layer to simplify the process. In addition, the thickness of the IC carrier can be reduced by the design of the height of the dielectric layer similar to the height of the conductive pillar and the conductive wire. Furthermore, the manufacturing method utilizes the vacuum laminating technology or the molding technology so that the pitch of the conductive wire can be reduced and the circuit layout is routable (surround setting) to improve the electromagnetic protection.

Even though numerous characteristics and advantages of certain inventive embodiments have been set out in the foregoing description, together with details of the structures and functions of the embodiments, the disclosure is illustrative only. Changes may be made in detail, especially in matters of arrangement of parts, within the principles of the present disclosure to the full extent indicated by the broad general meaning of the terms in which the appended claims are expressed.

What is claimed is:

1. A manufacturing method for making an IC carrier of a semiconductor package comprising:
   forming a patterned conductor layer on a surface of a temporary substrate;
   forming a dielectric layer on the surface of the temporary substrate and covering the patterned conductor layer;
   forming at least an opening groove in the dielectric layer to expose a part of the patterned conductor layer; and
   removing the temporary substrate to expose one side of the patterned conductor layer and a part of the dielectric layer,
   wherein a part of the patterned conductor layer forms a conductive pillar, which has two exposed ends, and a part of the patterned conductor layer forms a conductive wire, which only has one exposed end, the conductive pillar and the conductive wire are formed simultaneously in the same fabrication processing step so that a height of the conductive pillar is same as to a height of the conductive wire, and are electrically isolated from each other by the dielectric layer.

2. The manufacturing method according to claim 1, wherein the temporary substrate is made by iron, nickel, copper or composite with a dielectric material.

3. The manufacturing method according to claim 1, wherein forming the patterned conductor layer further comprising:
   forming a patterned photoresist layer having a plurality of openings on the surface of the temporary substrate;
   forming a conductive material in the openings; and
   removing the patterned photoresist layer to form the patterned conductor layer.

4. The manufacturing method according to claim 3, wherein the conductive material is made by plating technology, electroless plating technology, sputtering coating technology or thermal coating technology.

5. The manufacturing method according to claim 1, wherein the dielectric layer is made by vacuum laminating technology or molding technology.

6. The manufacturing method according to claim 5, wherein forming the dielectric layer further comprising:
providing a molding compound;
heating the molding compound into liquid;
injecting the molding compound to cover the patterned conductor layer; and
curing the molding compound to form the dielectric layer.

7. The manufacturing method according to claim 1, further comprising:
disposing a conductive layer in the opening groove.

8. The manufacturing method according to claim 7, further comprising:
forming a protective layer on a surface of the conductive layer and a surface of the patterned conductor layer exposed from the dielectric layer.

9. The manufacturing method according to claim 1, further comprising:
forming a protective layer on a surface of the patterned conductor layer exposed from the dielectric layer.

10. An IC carrier of a semiconductor package, comprising:
a dielectric layer, which has at least an opening groove; and
at least a patterned conductor layer, which is embedded in the dielectric layer,
wherein a part of the patterned conductor layer forms a conductive pillar, which has two exposed ends, and a part of the patterned conductor layer forms a conductive wire, which only has one exposed end, the conductive pillar and the conductive wire are electrically isolated from each other by the dielectric layer, and a height of the conductive pillar is same as to a height of the conductive wire.

11. The IC carrier according to claim 10, wherein the dielectric layer is made by vacuum laminating technology or molding technology.

12. The IC carrier according to claim 10, further comprises a conductive layer, which is disposed in the opening groove.

13. The IC carrier according to claim 12, further comprises a protective layer, which is disposed on a surface of the conductive layer and a surface of the patterned conductor layer exposed from the dielectric layer.

14. The IC carrier according to claim 10, further comprises a protective layer, which is disposed on a surface of the patterned conductor layer exposed from the dielectric layer.

15. A package structure according to claim 10, comprising:
a chip, which is disposed on a surface of the IC carrier; and
a sealing layer, which is seal around the chip.

16. The package structure according to claim 15, further comprises a solder bump, which is disposed in the opening groove to electrically connect to the conductive pillar.

* * * * *